(12) United States Patent
Chen

(10) Patent No.: US 11,098,788 B2
(45) Date of Patent: Aug. 24, 2021

(54) CURVATURE-ADJUSTABLE BACKBOARD ASSEMBLY AND CURVED DISPLAY DEVICE

(71) Applicant: TCL China Star Optoelectronics Technology Co., Ltd., Guangdong (CN)

(72) Inventor: Weifeng Chen, Shenzhen (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/881,008

(22) Filed: May 22, 2020

(65) Prior Publication Data
US 2020/0284327 A1    Sep. 10, 2020

Related U.S. Application Data

(62) Division of application No. 15/539,694, filed on Jun. 26, 2017, now Pat. No. 10,704,659.

(30) Foreign Application Priority Data

Apr. 14, 2017    (CN) .......................... 201710245924.1

(51) Int. Cl.
*F16H 21/22*    (2006.01)
*G02F 1/1333*   (2006.01)
(Continued)

(52) U.S. Cl.
CPC ........... *F16H 21/22* (2013.01); *G02F 1/1333* (2013.01); *H05K 5/0017* (2013.01);
(Continued)

(58) Field of Classification Search
CPC .......... F16H 21/22; F16H 21/24; F16H 21/34; G02F 1/1333; G02F 1/133305;
(Continued)

(56) References Cited

U.S. PATENT DOCUMENTS 6,065,523 A * 5/2000 Sanz ...................... B64C 1/1484
160/84.02
8,091,605 B1 * 1/2012 Melhart ................. G10K 11/20
160/135

(Continued)

FOREIGN PATENT DOCUMENTS

WO    WO-2017059631 A1 * 4/2017 ........... H05K 5/0017

*Primary Examiner* — Victor L MacArthur
(74) *Attorney, Agent, or Firm* — Leong C. Lei

(57) ABSTRACT

The present invention provides a curvature-adjustable backboard assembly and a curved display device. The curvature-adjustable backboard assembly of the present invention includes a curvable backboard, a slider-crank mechanism, and a first low-speed position-limiting electric machine. The slider-crank mechanism comprises a central pivot and a first rail that are fixed to the backboard, a first slider mounted to the first rail, a first crank that is rotatable about the central pivot as being driven by the first low-speed position-limiting electric machine, and a first connection rod having two ends respectively and pivotally coupled to the first slider and the first crank, wherein when the first crank is driven to rotate, the first connection rod drives the first slider to move along the first rail and during the movement of the first slider along the first rail, a height of an arched form of the backboard with respect to the central pivot at a location where the first slider passes may vary accordingly so as to allow for easy and efficient variation of a curvature of the backboard according to a desired curving condition.

6 Claims, 6 Drawing Sheets

(51) Int. Cl.
*H05K 5/00* (2006.01)
*H05K 5/02* (2006.01)
*F16H 21/24* (2006.01)
*F16H 21/34* (2006.01)

(52) U.S. Cl.
CPC ........... H05K 5/0217 (2013.01); *F16H 21/24* (2013.01); *F16H 21/34* (2013.01)

(58) Field of Classification Search
CPC .... H05K 5/0017; H05K 5/0217; G09F 9/301; G09F 19/02; G09F 15/031; G06F 1/1652; H01L 2251/5338
See application file for complete search history.

(56) References Cited

U.S. PATENT DOCUMENTS

| | | | | |
|---|---|---|---|---|
| 8,654,275 B2* | 2/2014 | Cheng | ................ | F16M 11/046 |
| | | | | 248/919 |
| 8,783,328 B2* | 7/2014 | Melhart | ................ | G10K 11/20 |
| | | | | 160/32 |
| 9,081,540 B1* | 7/2015 | Cho | ................ | G06F 1/1601 |
| 9,119,298 B2* | 8/2015 | Park | ................ | H05K 5/0226 |
| 9,286,812 B2* | 3/2016 | Bohn | ................ | G09F 9/301 |
| 9,307,658 B2* | 4/2016 | Song | ................ | H05K 5/0217 |
| 9,510,469 B2* | 11/2016 | Song | ................ | H05K 5/0217 |
| 9,763,346 B2* | 9/2017 | Li | ................ | H05K 5/0017 |
| 9,983,428 B2* | 5/2018 | Im | ................ | G02F 1/133308 |
| 10,025,355 B2* | 7/2018 | Bohn | ................ | G09F 9/35 |
| 10,484,642 B2* | 11/2019 | Park | ................ | H01L 51/52 |
| 2012/0152468 A1* | 6/2012 | Melhart | ................ | G10K 11/20 |
| | | | | 160/120 |
| 2012/0314400 A1* | 12/2012 | Bohn | ................ | G09F 9/301 |
| | | | | 362/97.1 |
| 2013/0107159 A1* | 5/2013 | Cheng | ................ | F16M 11/046 |
| | | | | 349/58 |
| 2014/0198465 A1* | 7/2014 | Park | ................ | H05K 5/0226 |
| | | | | 361/749 |
| 2014/0247544 A1* | 9/2014 | Ryu | ................ | G09F 11/18 |
| | | | | 361/679.01 |
| 2015/0296641 A1* | 10/2015 | Song | ................ | H05K 5/0217 |
| | | | | 361/679.01 |
| 2016/0147261 A1* | 5/2016 | Bohn | ................ | G09F 9/301 |
| | | | | 455/566 |
| 2016/0295711 A1* | 10/2016 | Ryu | ................ | G09F 9/301 |
| 2017/0188470 A1* | 6/2017 | Cho | ................ | G09F 9/301 |
| 2017/0238429 A1* | 8/2017 | Zeng | ................ | G09F 9/301 |
| | | | | 361/807 |

* cited by examiner

CURVATURE-ADJUSTABLE BACKBOARD ASSEMBLY AND CURVED DISPLAY DEVICE

CROSS REFERENCE TO RELATED APPLICATION

This is a divisional application of co-pending U.S. patent application Ser. No. 15/539,694, filed on Jun. 26, 2017, which is a national stage of PCT Application No. PCT/CN2017/085181, filed on May 19, 2017, claiming foreign priority of Chinese Patent Application No. 201710245924.1, filed on Apr. 14, 2017.

BACKGROUND OF THE INVENTION

1. Field of the Invention

The present invention relates to the field of display technology, and more particular to a curved backboard assembly and a curved display device.

2. The Related Arts

Recently, with the development of display technology, major manufacturers have marketed curved display devices, such as curved television. Generally speaking, the curved display device allows for the best viewing effect from center to edge, while a regular display device has poor capability of displaying at edges of a screen. The curved display device has a screen that is entirely of a curved design to provide a wide full-view image, providing the same visual enjoyment at both the central portion and the circumferential portion of the screen, ensuring clarity of observation of image at two opposite side edges of the screen, and also reducing distortion of off-axis viewing for viewing at a short distance, making the entire screen spacing from human eye lens by a consistent distance so that it is easier for a viewer to feel personally in the scene to have the feeling of immersion. Further, the curved display devices allow a viewer's viewing distance to be extended, achieving better experience of viewing. Thus, compared to the regular display devices, the curved display devices have great advantages, including: (1) product differentiating, (2) wider viewable angle, and (3) reduced distortion for short distance viewing The market of curved display devices is diversifying and particularly, curved display devices of different sizes and different radii of curvature that are currently available are undergoing diversification. Further, for different applications, the radius of curvature may need to adjust. Most of the curved display modules that are currently available adopt two common measures for realizing surface curving, one being forcibly bending a backboard to a desired curve by applying a bracing frame and then fixing a backlight module, the other one being forming a backboard into a curved structure and then fixing a backlight module. The backboards formed with these two measures do not allow for adjustability of the curvature of the curved display modules. In other words, the curvature of a curved display device is fixed and no adjustability of curvature can be made for one curved display device to suit the needs for different applications and it is not possible to do any adjustability to suit the needs of user's observation. Image displaying can be available for one single, fixed curvature and thus, the view angle is limited.

SUMMARY OF THE INVENTION

An objective of the present invention is to provide a curvature-adjustable backboard assembly, which allows for easy, efficient, and continuous adjustment of the curvature of a backboard.

Another objective of the present invention is to provide a curved display device, which uses the above curvature-adjustable backboard assembly so as to achieve easy, efficient, and continuous adjustment of the curvature of the curved display device, allowing a user, when viewing, to acquire different displaying condition according different requirements to thereby improve product attraction to the market and to make the structure simple and easy to achieve.

To achieve the above objectives, the present invention provides a curvature-adjustable backboard assembly, which comprises a backboard that is curvable, a slider-crank mechanism, and a first low-speed position-limiting electric machine;

wherein the slider-crank mechanism comprises a central pivot, a first crank, a first connection rod, a first slider, and a first rail, wherein the central pivot and the first rail are fixed on the backboard; the first slider is mounted on the first rail; the first connection rod has two ends respectively and pivotally coupled to the first slider and the first crank; and the first crank is drivable by the first low-speed position-limiting electric machine to rotate about the central pivot;

when the first low-speed position-limiting electric machine is activated to drive the first crank to rotate, the first connection rod drives the first slider to move along the first rail; and during the movement of the first slider along the first rail, a height difference between the first slider and the central pivot is kept constant so that a height of an arched form of the backboard with respect to the central pivot at a location corresponding to where the first slider is is kept constant and the height of the arched form of the backboard with respect to the central pivot at the location where the first slider passes varies accordingly to achieve an effect of varying a curvature of the backboard.

The slider-crank mechanism further comprises a second crank, a second connection rod, a second slider, and a second rail, wherein the second rail is fixed on the backboard; the second slider is mounted to the second rail; the second connection rod has two ends respectively and pivotally coupled to the second slider and the second crank; and the second crank is rotatable about the central pivot as being driven;

wherein when the second crank is driven to rotate, the second connection rod drives the second slider to move along the second rail; and during the movement of the second slider along the second rail, a height difference between the second slider and the central pivot is kept constant so that a height of an arched form of the backboard with respect to the central pivot at a location corresponding to where the second slider is is kept constant and the height of the arched form of the backboard with respect to the central pivot at the location where the second slider passes varies accordingly to achieve an effect of varying a curvature of the backboard.

In the slider-crank mechanism, pairs of the first crank and the second crank, the first connection rod and the second connection rod, the first slider and the second slider, and the first rail and the second rail are each set in a symmetric arrangement about a center defined by the central pivot; and the first crank and the second crank are both driven by the first low-speed position-limiting electric machine to rotate about the central pivot in a rotational direction.

The curvature-adjustable backboard assembly further comprises a remote control device, wherein the remote control device is connected, in a wireless manner, to the first low-speed position-limiting electric machine to control the first low-speed position-limiting electric machine for adjustment of the curvature of the backboard.

The slider-crank mechanism further comprises a third crank, a third connection rod, a third slider, a fourth crank, a fourth connection rod, and a fourth slider, wherein the third slider and the fourth slider are respectively mounted to the first rail and the second rail; the third connection rod has two ends respectively and pivotally coupled to the third slider and the third crank; the fourth connection rod has two ends respectively and pivotally coupled to the fourth slider and the fourth crank; and the third crank and the fourth crank are rotatable about the central pivot as being driven;

wherein when the third crank is driven to rotate, the third connection rod drives the third slider to move along the first rail; and during the movement of the third slider along the first rail, a height difference between the third slider and the central pivot is kept constant so that a height of an arched form of the backboard with respect to the central pivot at a location corresponding to where the third slider is is kept constant and the height of the arched form of the backboard with respect to the central pivot at the location where the third slider passes varies accordingly to achieve an effect of varying a curvature of the backboard; and wherein when the fourth crank is driven to rotate, the fourth connection rod drives the fourth slider to move along the second rail; and during the movement of the fourth slider along the second rail, a height difference between the fourth slider and the central pivot is kept constant so that a height of an arched form of the backboard with respect to the central pivot at a location corresponding to where the fourth slider is is kept constant and the height of the arched form of the backboard with respect to the central pivot at the location where the fourth slider passes varies accordingly to achieve an effect of varying a curvature of the backboard.

In the slider-crank mechanism, pairs of the first crank and the second crank, the first connection rod and the second connection rod, the first slider and the second slider, the third crank and the fourth crank, the third connection rod and the fourth connection rod, the third slider and the fourth slider, and the first rail and the second rail are each set in a symmetric arrangement about a center defined by the central pivot; and the first slider and the third slider are arranged symmetric on two opposite sides of a center of the first rail and the second slider and the fourth slider are arranged symmetric on two opposites ides of a center of the second rail.

The curvature-adjustable backboard assembly further comprises a second low-speed position-limiting electric machine;

wherein the first crank and the second crank are both driven by the first low-speed position-limiting electric machine to rotate about the central pivot in a rotational direction and the third crank and the fourth crank are both driven by the second low-speed position-limiting electric machine to rotate about the central pivot in a rotational direction.

The rotational direction of the first crank and the second crank driven by the first low-speed position-limiting electric machine is opposite to the rotational direction of the third crank and the fourth crank driven by the second low-speed position-limiting electric machine.

The curvature-adjustable backboard assembly further comprises a remote control device, wherein the remote control device is connected, in a wireless manner, to the first low-speed position-limiting electric machine and the second low-speed position-limiting electric machine to control the first low-speed position-limiting electric machine and the second low-speed position-limiting electric machine for adjustment of the curvature of the backboard The present invention also provides a curved display device, which comprises the above-described curvature-adjustable backboard assembly.

The present invention further provides a curvature-adjustable backboard assembly, which comprises a backboard that is curvable, a slider-crank mechanism, and a first low-speed position-limiting electric machine;

wherein the slider-crank mechanism comprises a central pivot, a first crank, a first connection rod, a first slider, and a first rail, wherein the central pivot and the first rail are fixed on the backboard; the first slider is mounted on the first rail; the first connection rod has two ends respectively and pivotally coupled to the first slider and the first crank; and the first crank is drivable by the first low-speed position-limiting electric machine to rotate about the central pivot;

when the first low-speed position-limiting electric machine is activated to drive the first crank to rotate, the first connection rod drives the first slider to move along the first rail; and during the movement of the first slider along the first rail, a height difference between the first slider and the central pivot is kept constant so that a height of an arched form of the backboard with respect to the central pivot at a location corresponding to where the first slider is is kept constant and the height of the arched form of the backboard with respect to the central pivot at the location where the first slider passes varies accordingly to achieve an effect of varying a curvature of the backboard;

wherein the slider-crank mechanism further comprises a second crank, a second connection rod, a second slider, and a second rail, wherein the second rail is fixed on the backboard; the second slider is mounted to the second rail; the second connection rod has two ends respectively and pivotally coupled to the second slider and the second crank; and the second crank is rotatable about the central pivot as being driven;

wherein when the second crank is driven to rotate, the second connection rod drives the second slider to move along the second rail; and during the movement of the second slider along the second rail, a height difference between the second slider and the central pivot is kept constant so that a height of an arched form of the backboard with respect to the central pivot at a location corresponding to where the second slider is is kept constant and the height of the arched form of the backboard with respect to the central pivot at the location where the second slider passes varies accordingly to achieve an effect of varying a curvature of the backboard; and wherein a remote control device is further included, wherein the remote control device is connected, in a wireless manner, to the first low-speed position-limiting electric machine to control the first low-speed position-limiting electric machine for adjustment of the curvature of the backboard.

The efficacy of the present invention is that the present invention provides a curvature-adjustable backboard assembly, which comprises a curvable backboard, a slider-crank mechanism, and a first low-speed position-limiting electric machine. The slider-crank mechanism comprises a central pivot and a first rail that are fixed to the backboard, a first slider mounted to the first rail, a first crank that is rotatable about the central pivot as being driven by the first low-speed position-limiting electric machine, and a first connection rod having two ends respectively and pivotally coupled to the first slider and the first crank, wherein when the first crank is driven to rotate, the first connection rod drives the first slider to move along the first rail and during the movement of the first slider along the first rail, a height of an arched form of the backboard with respect to the central pivot at a location where the first slider passes may vary accordingly so as to allow for easy and efficient variation of a curvature of the backboard according to a desired curving condition. The present invention provides a curved display device, which includes the above-described curvature-adjustable backboard assembly, allowing for easy, efficient, and continuous adjustment of the curvature of the curved display device, allowing a user, when viewing, to acquire different displaying condition according different requirements to thereby improve product attraction to the market and to make the structure simple and easy to achieve.

BRIEF DESCRIPTION OF THE DRAWINGS

The technical solution, as well as other beneficial advantages, of the present invention will be apparent from the following detailed description of embodiments of the present invention, with reference to the attached drawing.

In the drawings.

DETAILED DESCRIPTOIN OF THE PREFERRED EMBODIMENTS

To further expound the technical solution adopted in the present invention and the advantages thereof, a detailed description will be given with reference to the preferred embodiments of the present invention and the drawings thereof.

Figure 1:
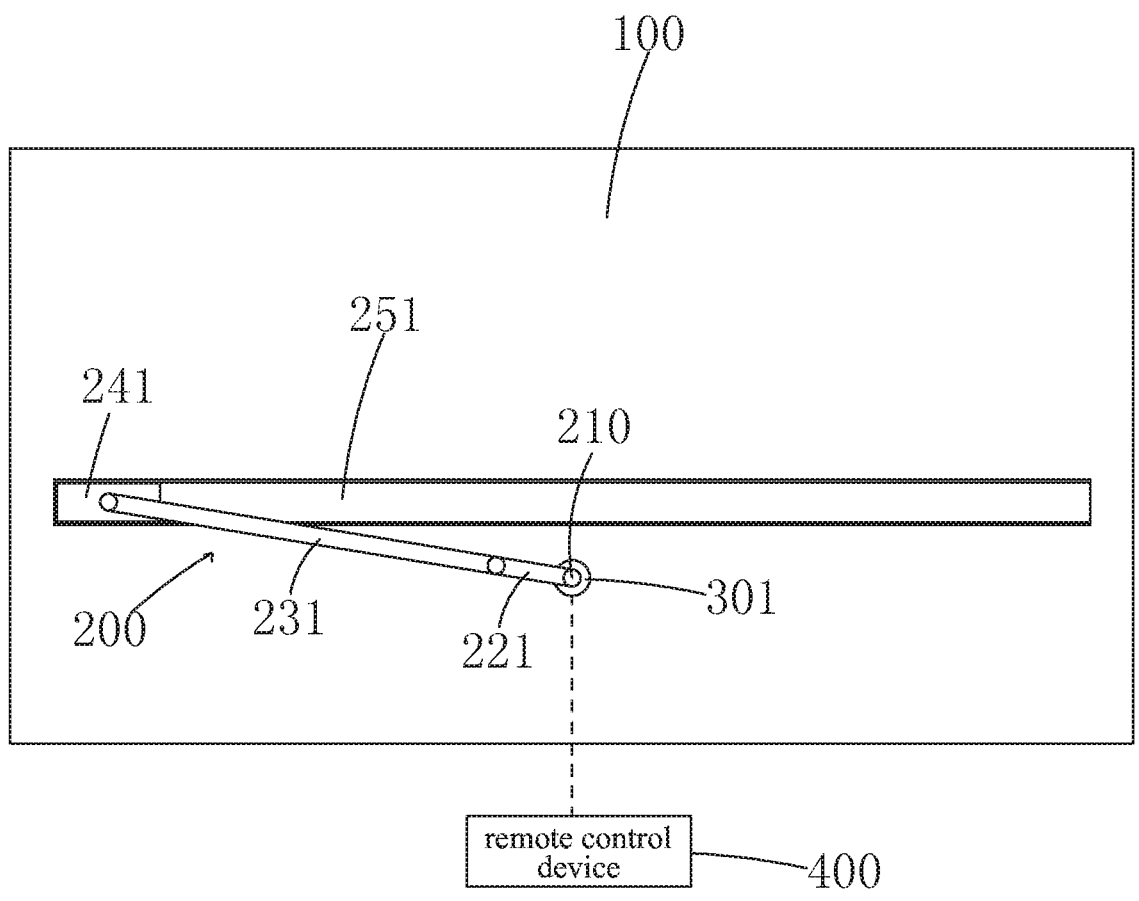
FIG. 1 is a schematic rear view illustrating a curvature-adjustable backboard assembly according to a first embodiment of the present invention in a state of maximum radius of curvature.
Figure 2:
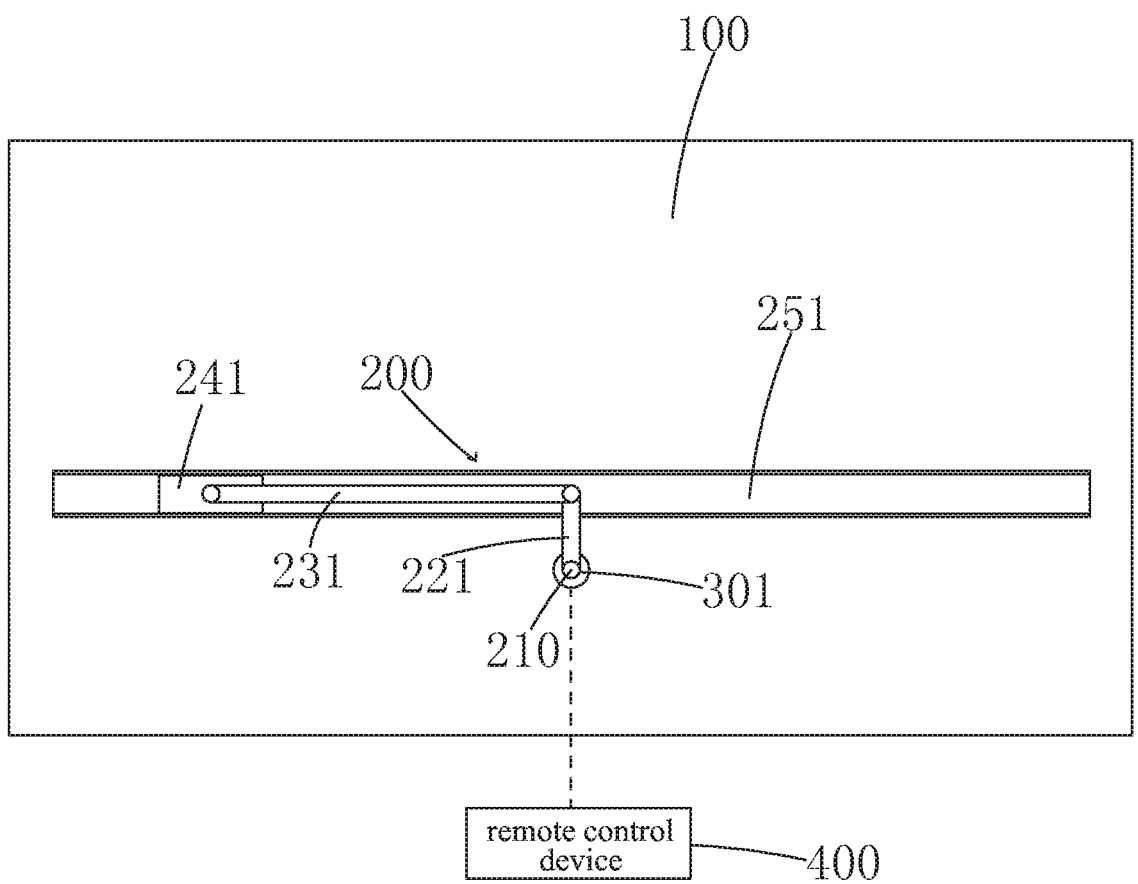
FIG. 2 is a schematic view illustrating the curvature-adjustable backboard assembly according to the first embodiment of the present invention in a state of minimum radius of curvature.

Referring to FIGS. 1-2, FIGS. 1 and 2 are schematic rear views respectively illustrating a curvature-adjustable backboard assembly according to a first embodiment of the present invention in a state of maximum radius of curvature and a state of minimum radius of curvature. In the instant embodiment, the curvature-adjustable backboard assembly comprises a backboard 100 that is curvable, a slider-crank mechanism 200, and a first low-speed position-limiting electric machine 301.

The slider-crank mechanism 200 comprises a central pivot 210, a first crank 221, a first connection rod 231, a first slider 241, and the first rail 251, wherein the central pivot 210 and the first rail 251 are fixed on the backboard 100; the first slider 241 is mounted on the first rail 251; the first connection rod 231 has two ends respectively and pivotally coupled to the first slider 241 and the first crank 221; and the first crank 221 is drivable by the first low-speed position-limiting electric machine 301 to rotate about the central pivot 210.

When the first low-speed position-limiting electric machine 301 is activated to drive the first crank 221 to rotate, the first connection rod 231 drives the first slider 241 to move along the first rail 251. And, when the first slider 241 is moving along the first rail 251, a height of an arched form of the backboard 100 corresponding to the site where the first slider 241 passes varies so as to achieve an effect of varying a curvature of the backboard 100.

Figure 3:
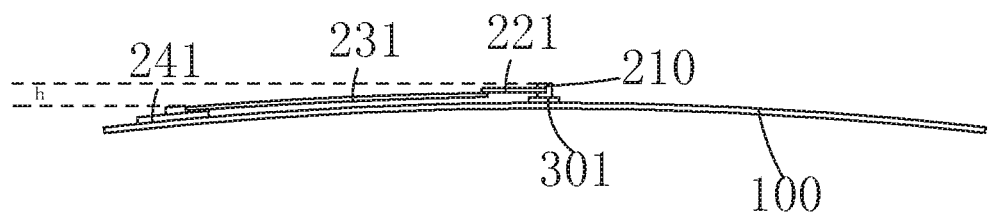
FIG. 3 is a schematic top plan view illustrating the curvature-adjustable backboard assembly according to the first embodiment of the present invention in the state of maximum radius of curvature.
Figure 4:
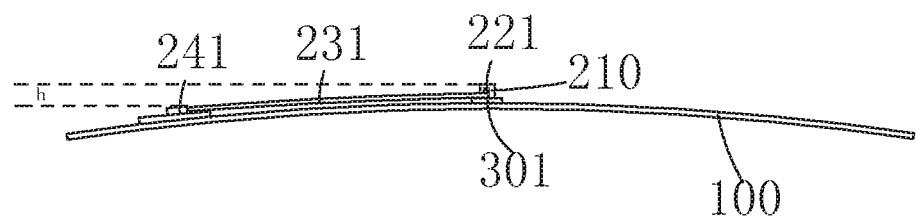
FIG. 4 is a schematic top plan view illustrating the curvature-adjustable backboard assembly according to the first embodiment of the present invention in the state of minimum radius of curvature.

Specifically, in the instant embodiment, the operation of the curvature-adjustable backboard assembly is as follows. As shown in FIG. 1, an initial condition of the backboard 100 is taken as the state of maximum radius of curvature of the backboard 100, where the slider-crank mechanism 200 is in an extreme extension condition, namely the first crank 221 and the first connection rod 231 are set in a linear condition on a back surface of the backboard 100, and under this condition, the location of the first slider 241 is closest to a side edge of the backboard 100. When the first low-speed position-limiting electric machine 301 is activated and drives the first crank 221 to rotate, the first slider 241 moves along the first rail 251 until the slider-crank mechanism 200 reaches an extreme contraction condition, and as shown in FIG. 2, under this condition, the first crank 221 and the first connection rod 231 are in a perpendicular condition on the back surface of the backboard 100 and the location of the first slider 241 is closest to a central location of the backboard 100. As shown in FIGS. 3-4, during the movement of the first slider 241, a height difference h between the central pivot 210 and the first slider 241 of the slider-crank mechanism 200 is kept constant and generally invariant. In other words, the height of the arched form of the backboard 100 with respect to the central pivot 210 at a location corresponding to where the first slider 241 is is kept constant. Further, the first slider 241 is mounted on the first rail 251 so that when the first slider 241 is moving along the first rail 251, the height of the arched form of the backboard 100 with respect to the central pivot 210 at the location where the first slider 241 passes may vary with the movement of the first slider 241 so as to achieve an effect of varying the curvature of the backboard 100.

Specifically, the curvature-adjustable backboard assembly of the present invention further comprises a remote control device 400. The remote control device 400 is connected, in a wireless manner, to the first low-speed position-limiting electric machine 301 so as to achieve control of the operation of the first low-speed position-limiting electric machine 301 and thus, adjustment of the curvature of the backboard 100. The present invention uses remote control to achieve control of variation of the curvature of the backboard 100 so as to realize easy operation.

Figure 5:
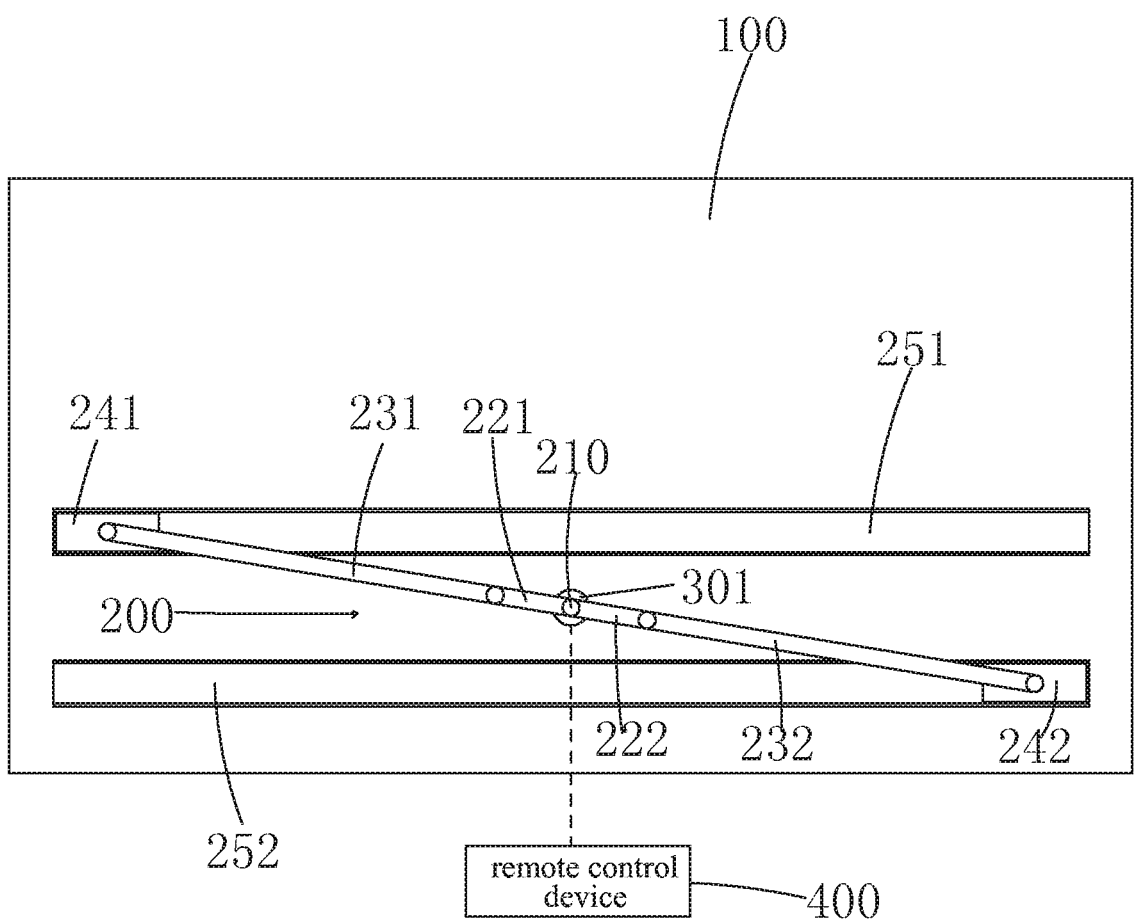
FIG. 5 is a schematic rear view illustrating a curvature-adjustable backboard assembly according to a second embodiment of the present invention in a state of maximum radius of curvature.
Figure 6:
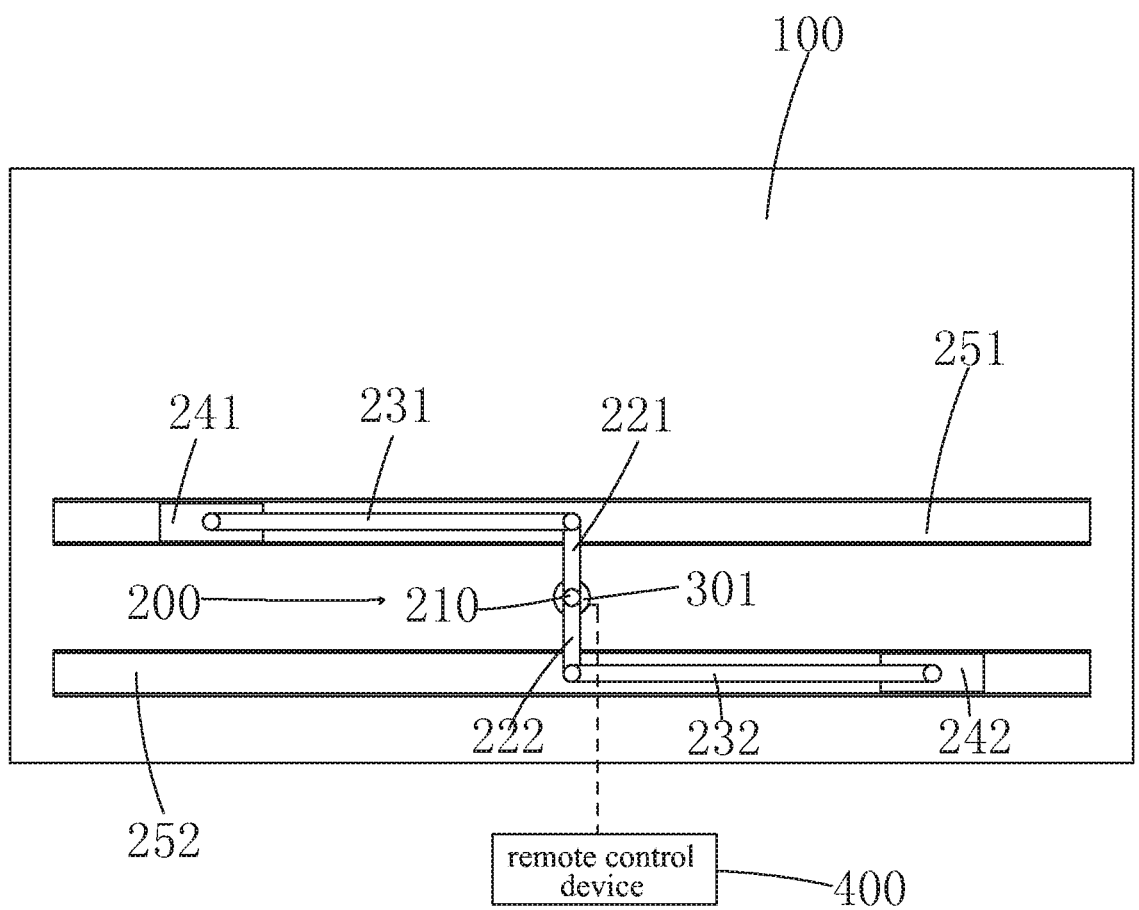
FIG. 6 is a schematic view illustrating the curvature-adjustable backboard assembly according to the second embodiment of the present invention in a state of minimum radius of curvature.

Referring to FIGS. 5-6, FIGS. 5 and 6 are schematic rear views respectively illustrating a curvature-adjustable backboard assembly according to a second embodiment of the present invention in a state of maximum radius of curvature and a state of minimum radius of curvature. Compared to the above-described first embodiment, in the instant embodiment, the slider-crank mechanism 200 further comprises a second crank 222, a second connection rod 232, a second slider 242, and a second rail 252, wherein the second rail 252 is fixed to the backboard 100; the second slider 242 is mounted on the second rail 252; the second connection rod 232 has two ends respectively and pivotally coupled to the second slider 242 and the second crank 222; and the second crank 222 is drivable to rotate about the central pivot 210.

Similar to the operation principle described above, when the second crank 222 is driven to rotate, the second connection rod 232 drives the second slider 242 to move along the second rail 252. During the movement of the second slider 242 along the second rail 252, a height difference between the central pivot 210 and the second slider 242 of the slider-crank mechanism 200 is kept constant and generally invariant. In other words, the height of the arched form of the backboard 100 with respect to the central pivot 210 at a location corresponding to where the second slider 242 is is kept constant. Further, the second slider 242 is mounted to the second rail 252 so that when the second slider 242 is moving along the second rail 252, the height of the arched form of the backboard 100 with respect to the central pivot 210 at the location where the second slider 242 passes may vary with the movement of the second slider 242 so as to achieve an effect of varying the curvature of the backboard 100.

Specifically, in the slider-crank mechanism 200, pairs of the first crank 221 and the second crank 222, the first connection rod 231 and the second connection rod 232, the first slider 241 and the second slider 242, and the first rail 251 and the second rail 252 are each set in a symmetric arrangement about a center defined by the central pivot 210; and the first crank 221 and the second crank 222 are both driven by the first low-speed position-limiting electric machine 301 to rotate about the central pivot 210 in the same direction.

Figure 7:
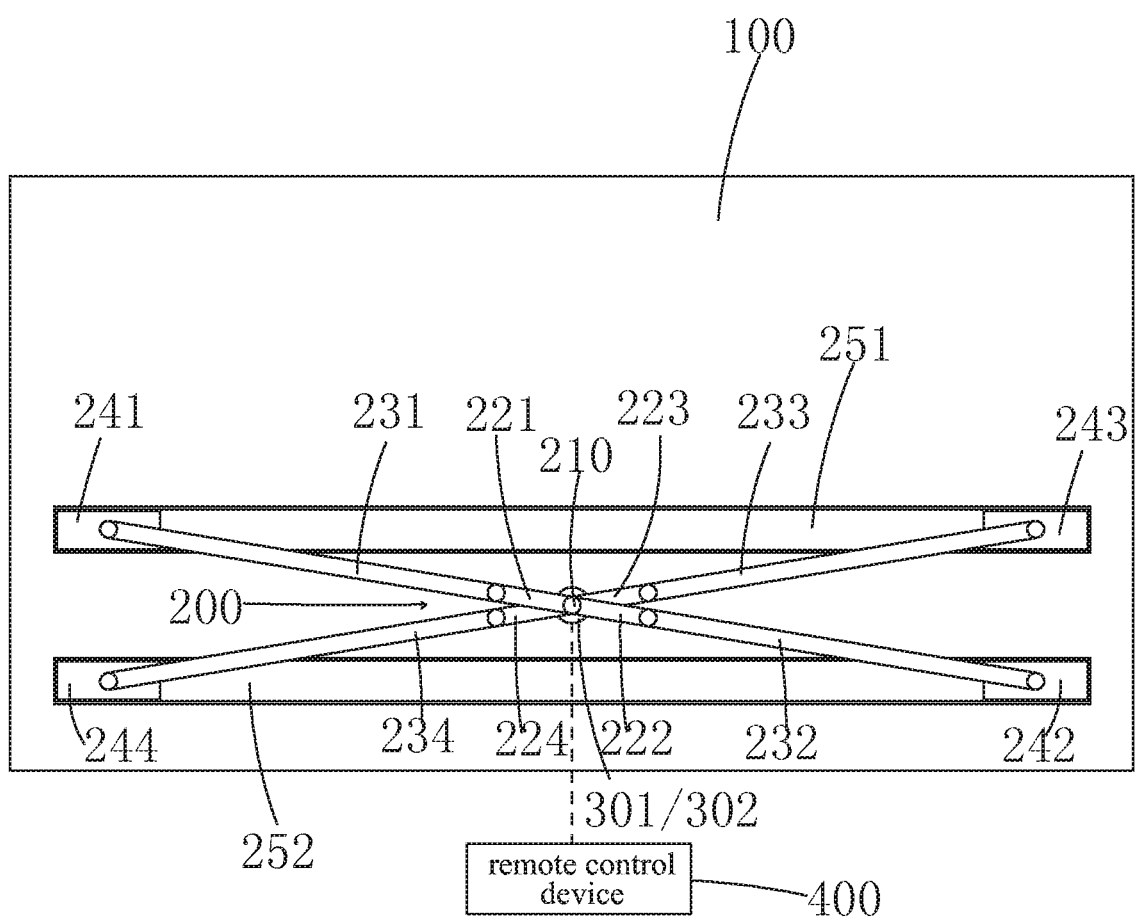
FIG. 7 is a schematic rear view illustrating a curvature-adjustable backboard assembly according to a third embodiment of the present invention in a state of maximum radius of curvature.
Figure 8:
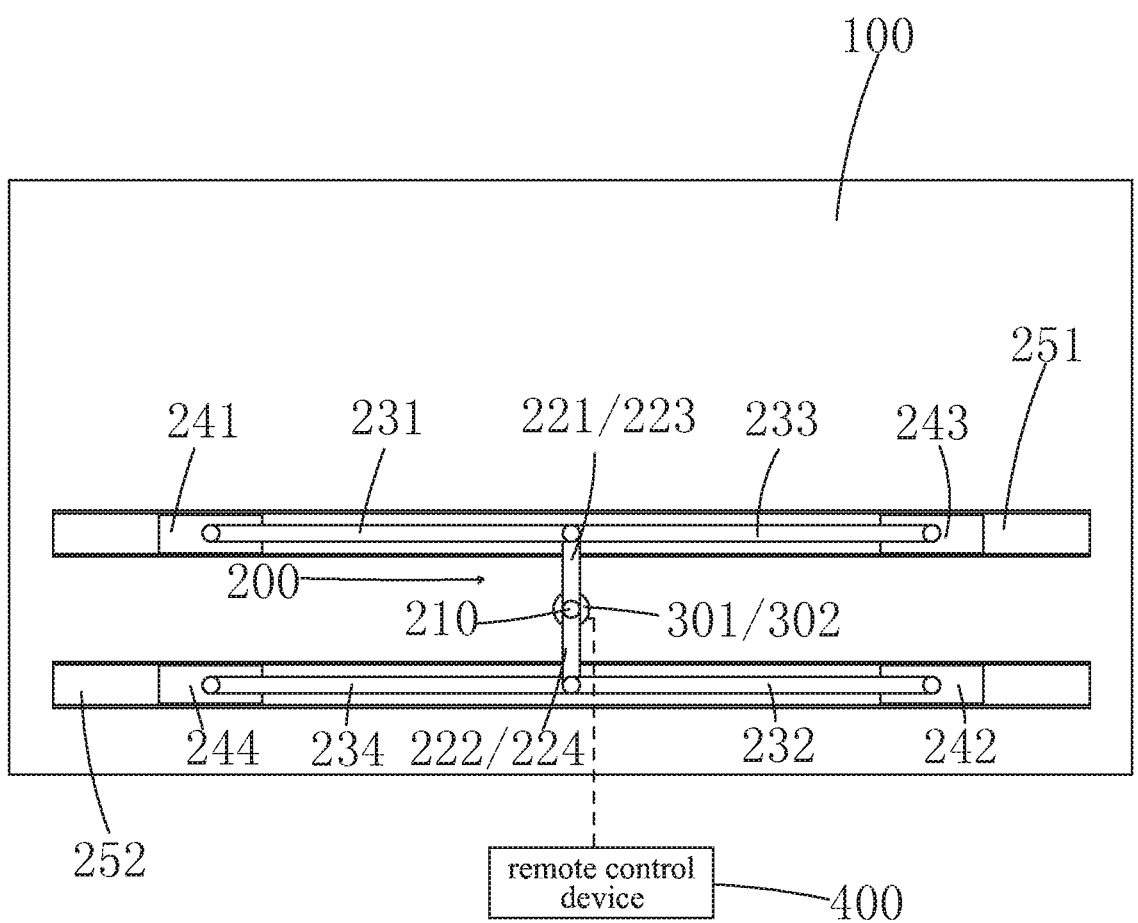
FIG. 8 is a schematic view illustrating the curvature-adjustable backboard assembly according to the third embodiment of the present invention in a state of minimum radius of curvature.

Referring to FIGS. 7-8, FIGS. 7 and 8 are schematic rear views respectively illustrating a curvature-adjustable backboard assembly according to a second embodiment of the present invention in a state of maximum radius of third and a state of minimum radius of curvature. Compared to the above-described second embodiment, in the instant embodiment, the slider-crank mechanism 200 further comprises a third crank 223, a third connection rod 233, a third slider 243, a fourth crank 224, a fourth connection rod 234, and a fourth slider 244, wherein the third slider 243 and the fourth slider 244 are respectively mounted to the first rail 251 and the second rail 252; the third connection rod 233 has two ends respectively and pivotally coupled to the third slider 243 and the third crank 223; the fourth connection rod 234 has two ends respectively and pivotally coupled to the fourth slider 244 and the fourth crank 224; and the third crank 223 and the fourth crank 224 are drivable to rotatable about the central pivot 210.

Similar to the operation principle described above, when the third crank 223 is driven to rotate, the third connection rod 233 drives the third slider 243 to move along the first rail 251. During the movement of the third slider 243 along the first rail 251, a height difference between the central pivot 210 and the third slider 243 of the slider-crank mechanism 200 is kept constant and generally invariant. In other words, the height of the arched form of the backboard 100 with respect to the central pivot 210 at a location corresponding to where the third slider 243 is is kept constant. Further, the third slider 243 is mounted to the first rail 251 so that when the third slider 243 is moving along the first rail 251, the height of the arched form of the backboard 100 with respect to the central pivot 210 at the location where the third slider 243 passes may vary with the movement of the third slider 243 so as to achieve an effect of varying the curvature of the backboard 100.

Similar to the operation principle described above, when the fourth crank 224 is driven to rotate, the fourth connection rod 234 drives the fourth slider 244 to move along the second rail 252. During the movement of the fourth slider 244 along the second rail 252, a height difference between the central pivot 210 and the fourth slider 244 of the slider-crank mechanism 200 is kept constant and generally invariant. In other words, the height of the arched form of the backboard 100 with respect to the central pivot 210 at a location corresponding to where the fourth slider 244 is is kept constant. Further, the fourth slider 244 is mounted to the second rail 252 so that when the fourth slider 244 is moving along the second rail 252, the height of the arched form of the backboard 100 with respect to the central pivot 210 at the location where the fourth slider 244 passes may vary with the movement of the fourth slider 244 so as to achieve an effect of varying the curvature of the backboard 100.

Specifically, in the slider-crank mechanism 200, pairs of the first crank 221 and the second crank 222, the first connection rod 231 and 232, the first slider 241 and the second slider 242, the third crank 223 and the fourth crank 224, the third connection rod 233 and the fourth connection rod 234, the third slider 243 and the fourth slider 244, and the first rail 251 and the second rail 252 are each set in a symmetric arrangement about a center defined by the central pivot 210; and the first slider 241 and the third slider 243 are arranged symmetric on two opposite sides of a center of the first rail 251 and the second slider 242 and the fourth slider 244 are arranged symmetric on two opposites ides of a center of the second rail 252.

Specifically, in the instant embodiment, the curvature-adjustable backboard assembly further comprises a second low-speed position-limiting electric machine 302.

The first crank 221 and the second crank 222 are driven by the first low-speed position-limiting electric machine 301 to rotate about the central pivot 210 in the same direction, and the third crank 223 and the fourth crank 224 are driven by the second low-speed position-limiting electric machine 302 to rotate about the central pivot 210 in the same direction.

Specifically, the rotational direction of the first crank 221 and the second crank 222 driven by the first low-speed position-limiting electric machine 301 is opposite to the rotational direction of the third crank 223 and the fourth crank 224 driven by the second low-speed position-limiting electric machine 302.

Specifically, in the instant embodiment, the remote control device 400 is also connected, in a wireless manner, to the second low-speed position-limiting electric machine 302 so as to control simultaneously the first low-speed position-limiting electric machine 301 and the second low-speed position-limiting electric machine 302 to achieve adjustment of the curvature of the backboard 100.

Based on the above-described curvature-adjustable backboard assembly, the present invention also provides a curved display device, which comprises the above-described curvature-adjustable backboard assembly. A repeated description of the specific structure of the curvature-adjustable backboard assembly will be omitted herein.

In summary, the present invention provides a curvature-adjustable backboard assembly, which comprises a curvable backboard, a slider-crank mechanism, and a first low-speed position-limiting electric machine. The slider-crank mechanism comprises a central pivot and a first rail that are fixed to the backboard, a first slider mounted to the first rail, a first crank that is rotatable about the central pivot as being driven by the first low-speed position-limiting electric machine, and a first connection rod having two ends respectively and pivotally coupled to the first slider and the first crank, wherein when the first crank is driven to rotate, the first connection rod drives the first slider to move along the first rail and during the movement of the first slider along the first rail, a height of an arched form of the backboard with respect to the central pivot at a location where the first slider passes may vary accordingly so as to allow for easy and efficient variation of a curvature of the backboard according to a desired curving condition. The present invention provides a curved display device, which includes the above-described curvature-adjustable backboard assembly, allowing for easy, efficient, and continuous adjustment of the curvature of the curved display device, allowing a user, when viewing, to acquire different displaying condition according different requirements to thereby improve product attraction to the market and to make the structure simple and easy to achieve.

Based on the description given above, those having ordinary skills in the art may easily contemplate various changes and modifications of he technical solution and the technical ideas of the present invention. All these changes and modifications are considered belonging to the protection scope of the present invention as defined in the appended claims.

What is claimed is:

1. A curvature-adjustable backboard assembly, comprising a backboard that is curvable, a slider-crank mechanism, and a first low-speed position-limiting electric machine;
    wherein the slider-crank mechanism comprises a central pivot, a first crank, a first connection rod, a first slider, and a first rail, wherein the central pivot and the first rail are fixed on the backboard; the first slider is mounted on the first rail; the first connection rod has two ends respectively and pivotally coupled to the first slider and the first crank; and the first crank is drivable by the first low-speed position-limiting electric machine to rotate about the central pivot;
    when the first low-speed position-limiting electric machine is activated to drive the first crank to rotate, the first connection rod drives the first slider to move along the first rail;
    wherein the slider-crank mechanism further comprises a second crank, a second connection rod, a second slider, and a second rail, wherein the second rail is fixed on the backboard; the second slider is mounted to the second rail; the second connection rod has two ends respectively and pivotally coupled to the second slider and the second crank; and the second crank is rotatable about the central pivot as being driven;
    wherein when the second crank is driven to rotate, the second connection rod drives the second slider to move along the second rail; and during the movement of the second slider along the second rail, a height difference between the second slider and the central pivot is kept constant so that a height of an arched form of the backboard with respect to the central pivot at a location corresponding to where the second slider is is kept constant and the height of the arched form of the backboard with respect to the central pivot at the location where the second slider passes varies accordingly to achieve an effect of varying a curvature of the backboard; and
    further comprising a remote control device, wherein the remote control device is connected, in a wireless manner, to the first low-speed position-limiting electric machine to control the first low-speed position-limiting electric machine for adjustment of the curvature of the backboard.

2. The curvature-adjustable backboard assembly as claimed in claim 1, wherein in the slider-crank mechanism, pairs of the first crank and the second crank, the first connection rod and the second connection rod, the first slider and the second slider, and the first rail and the second rail are each set in a symmetric arrangement about a center defined by the central pivot; and
    the first crank and the second crank are both driven by the first low-speed position-limiting electric machine to rotate about the central pivot in a rotational direction.

3. The curvature-adjustable backboard assembly as claimed in claim 1, wherein the slider-crank mechanism further comprises a third crank, a third connection rod, a third slider, a fourth crank, a fourth connection rod, and a fourth slider, wherein the third slider and the fourth slider are respectively mounted to the first rail and the second rail; the third connection rod has two ends respectively and pivotally coupled to the third slider and the third crank; the fourth connection rod has two ends respectively and pivotally coupled to the fourth slider and the fourth crank; and the third crank and the fourth crank are rotatable about the central pivot as being driven;
    wherein when the third crank is driven to rotate, the third connection rod drives the third slider to move along the first rail; and during the movement of the third slider along the first rail, a height difference between the third slider and the central pivot is kept constant so that a height of an arched form of the backboard with respect to the central pivot at a location corresponding to where the third slider is is kept constant and the height of the arched form of the backboard with respect to the central pivot at the location where the third slider passes varies accordingly to achieve an effect of varying a curvature of the backboard; and
    wherein when the fourth crank is driven to rotate, the fourth connection rod drives the fourth slider to move along the second rail; and during the movement of the fourth slider along the second rail, a height difference between the fourth slider and the central pivot is kept constant so that a height of an arched form of the backboard with respect to the central pivot at a location corresponding to where the fourth slider is is kept constant and the height of the arched form of the backboard with respect to the central pivot at the location where the fourth slider passes varies accordingly to achieve an effect of varying a curvature of the backboard.

4. The curvature-adjustable backboard assembly as claimed in claim 3, wherein in the slider-crank mechanism, pairs of the first crank and the second crank, the first connection rod and the second connection rod, the first slider and the second slider, the third crank and the fourth crank, the third connection rod and the fourth connection rod, the third slider and the fourth slider, and the first rail and the second rail are each set in a symmetric arrangement about a center defined by the central pivot; and the first slider and the third slider are arranged symmetric on two opposite sides of a center of the first rail and the second slider and the fourth slider are arranged symmetric on two opposites ides of a center of the second rail.

5. The curvature-adjustable backboard assembly as claimed in claim 4 further comprising a second low-speed position-limiting electric machine;
   wherein the first crank and the second crank are both driven by the first low-speed position-limiting electric machine to rotate about the central pivot in a rotational direction and the third crank and the fourth crank are both driven by the second low-speed position-limiting electric machine to rotate about the central pivot in a rotational direction.

6. The curvature-adjustable backboard assembly as claimed in claim 5, wherein the rotational direction of the first crank and the second crank driven by the first low-speed position-limiting electric machine is opposite to the rotational direction of the third crank and the fourth crank driven by the second low-speed position-limiting electric machine.

* * * * *